(12) United States Patent
Wang et al.

(10) Patent No.: US 11,100,878 B2
(45) Date of Patent: Aug. 24, 2021

(54) SHIFT REGISTER UNIT AND DRIVING METHOD THEREOF, GATE DRIVE CIRCUIT AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Zhichong Wang, Beijing (CN); Haoliang Zheng, Beijing (CN); Guangliang Shang, Beijing (CN); Seung Woo Han, Beijing (CN); Yinglong Huang, Beijing (CN)

(73) Assignees: ORDOS YUANSHENG OPTOELECTRONICS CO., LTD, Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 37 days.

(21) Appl. No.: 16/461,818

(22) PCT Filed: Nov. 5, 2018

(86) PCT No.: PCT/CN2018/113975
§ 371 (c)(1),
(2) Date: May 17, 2019

(87) PCT Pub. No.: WO2019/184354
PCT Pub. Date: Oct. 3, 2019

(65) Prior Publication Data
US 2020/0273419 A1    Aug. 27, 2020

(30) Foreign Application Priority Data
Mar. 30, 2018 (CN) .......................... 201810290682.2

(51) Int. Cl.
*G09G 3/36* (2006.01)

(52) U.S. Cl.
CPC ... *G09G 3/3677* (2013.01); *G09G 2300/0408* (2013.01); *G09G 2310/0283* (2013.01);
(Continued)

(58) Field of Classification Search
CPC ... G09G 2300/0408; G09G 2310/0267; G09G 2310/0283; G09G 2310/0286; G09G 2310/061; G09G 3/20; G09G 3/3677
See application file for complete search history.

(56) References Cited

U.S. PATENT DOCUMENTS 6,426,743 B1    7/2002    Yeo et al.
8,023,610 B2    9/2011    Miyayama et al.
(Continued)

FOREIGN PATENT DOCUMENTS

CN    101242178 A    8/2008
CN    101546607 A    9/2009
(Continued)

OTHER PUBLICATIONS

International Search Report and Written Opinion in corresponding International Patent Application No. PCT/CN2018/113975 dated Feb. 2, 2019. 17 pages. (English translation attached.)
(Continued)

*Primary Examiner* — Dmitriy Bolotin
(74) *Attorney, Agent, or Firm* — Leason Ellis LLP

(57) ABSTRACT

A shift register unit and a driving method, a grid driving circuit and a display device are disclosed. A shift register unit includes an input circuit, a first reset circuit, and an output circuit. The input circuit includes an input terminal configured to perform a first control on the first control node and the first node in response to an input signal of the input terminal, and then perform a second control on the first node (Continued)

under the control of the level of the first node, the first node is located in a path where the input signal incurs the first control; the first reset circuit is configured to reset the first control node in response to the first reset signal; the output circuit is configured to output an output signal to an output terminal under the control of the level of the first control node.

16 Claims, 11 Drawing Sheets

(52) U.S. Cl.
CPC ............... *G09G 2310/0286* (2013.01); *G09G 2310/061* (2013.01)

(56) References Cited

U.S. PATENT DOCUMENTS

| | | | |
|---|---|---|---|
| 9,257,084 B2 | 2/2016 | Cao et al. | |
| 2011/0122988 A1* | 5/2011 | Miyayama | G11C 19/28 377/64 |
| 2016/0125954 A1 | 5/2016 | Gu | |
| 2019/0066562 A1* | 2/2019 | Hu | G11C 19/28 |
| 2019/0114980 A1* | 4/2019 | Kim | G02F 1/136213 |
| 2019/0139475 A1 | 5/2019 | Wang et al. | |
| 2020/0035163 A1* | 1/2020 | Sun | G09G 3/3258 |

FOREIGN PATENT DOCUMENTS

| | | |
|---|---|---|
| CN | 103489484 A | 1/2014 |
| CN | 104332181 A | 2/2015 |
| CN | 104332182 A | 2/2015 |
| CN | 106531117 A | 3/2017 |
| CN | 107274856 | 10/2017 |
| CN | 107657983 A | 2/2018 |
| CN | 108648705 A | 10/2018 |

OTHER PUBLICATIONS

Korean Patent Office Action dated Nov. 24, 2020 corresponding to Korean Patent Application No. 10-2019-7025793; 14 pages.
Indian Patent Office Action dated Feb. 15, 2021 corresponding to Indian Patent Application No. 201947033794; 6 pages.

\* cited by examiner

US 11,100,878 B2

SHIFT REGISTER UNIT AND DRIVING METHOD THEREOF, GATE DRIVE CIRCUIT AND DISPLAY DEVICE

The present application is a U.S. National Stage Application under 35 U.S.C. § 371 of International Patent Application No. PCT/CN2018/113975, filed Nov. 5, 2018, which claims priority to Chinese patent application No. 201810290682.2, filed on Mar. 30, 2018, both of which are incorporated herein by reference in their entireties as part of this application.

TECHNICAL FIELD

The embodiments of the present disclosure relate to a shift register unit and a driving method thereof, a gate drive circuit and a display device.

BACKGROUND

In the field of display technology, a pixel array such as of a liquid crystal display panel usually includes a plurality of rows of gate lines and a plurality of columns of data lines that are intersected with the gate lines. The gate lines can be driven by a bonded integrated drive circuits. In recent years, with the continuous improvement of the preparation technology for amorphous silicon thin film transistor or oxide thin film transistor, it is also possible to directly integrate a gate driver circuit on a thin film transistor array substrate to form a GOA (Gate driver On Array) to drive the gate lines. For example, a GOA comprising a plurality of cascaded shift register units can be used to provide switching state voltage signals for the rows of gate lines of a pixel array, so as to control the rows of gate lines to be sequentially turned on, for example, and simultaneously data signals are provided to the pixel units of corresponding rows in the pixel array by data lines to form gray scale voltages in each pixel unit required for various gray scales of a displayed image, thereby displaying one frame of image. Nowadays, more and more display panels use the GOA technology to drive gate lines. The GOA technology helps to realize a narrow bezel design and can reduce production costs.

SUMMARY

At least an embodiment of the present disclosure provides a shift register unit including an input circuit, a first reset circuit, and an output circuit. The input circuit includes an input terminal configured to perform a first control on a first control node and a first node in response to an input signal of the input terminal, and then perform a second control, which is different from the first control, on the first node under a control of a level of the first node, the first node is located in a path where the input signal incurs the first control on the first control node; the first reset circuit is configured to reset the first control node in response to a first reset signal; the output circuit is configured to output an output signal to an output terminal under a control of a level of the first control node.

For example, in the shift register unit provided by an embodiment of the present disclosure, the input circuit includes a first input sub-circuit, a second input sub-circuit and a first node discharge sub-circuit. The first input sub-circuit is configured to perform the first control on the first node in response to the input signal; the second input sub-circuit is configured to perform the first control on the first control node in response to the input signal; the first node discharge sub-circuit is configured to perform the second control on the first node under the control of the level of the first node.

For example, in the shift register unit provided by an embodiment of the present disclosure, the first input sub-circuit includes a first transistor, the gate electrode of the first transistor and the input terminal are connected to receive the input signal, the first electrode and the first voltage terminal of the first transistor are connected to receive a first voltage, and the second electrode of the first transistor is connected to the first node; the second input sub-circuit includes a second transistor, a gate electrode of which is connected to the input terminal to receive the input signal, a first electrode of which is connected to the first node, and a second electrode of which is connected to the first control node; the first node discharge sub-circuit includes a third transistor, a gate electrode and a first electrode of which are electrically connected to each other and configured to be both connected to the first node, and a second electrode of which is connected to a second control path.

For example, in the shift register unit provided in an embodiment of the present disclosure, the second control path is the input terminal.

For example, in the shift register unit provided in an embodiment of the present disclosure, the first reset circuit is symmetrically disposed with the input circuit, and the first reset circuit includes a first reset terminal and is configured to perform the second control on the second node under a control of both the level of the first reset signal of the first reset terminal and the level of the second node, and the second node is located in the path where the first reset signal incurs the second control on the first control node.

For example, in the shift register unit provided by an embodiment of the present disclosure, the first reset circuit includes a first reset sub-circuit, a second reset sub-circuit and a second node discharge sub-circuit. The first reset sub-circuit is configured to reset a second node in response to the first reset signal; the second reset sub-circuit is configured to reset the first control node in response to the first reset signal; the second node discharge sub-circuit is configured to perform the second control on the second node under a control of the level of the second node.

For example, in the shift register unit provided by an embodiment of the present disclosure, the first reset sub-circuit includes a fourth transistor, the gate electrode of the fourth transistor is connected to the first reset terminal to receive the first reset signal, the first electrode of the fourth transistor is connected to a second voltage terminal to receive a second voltage, and the second electrode of the fourth transistor is connected to the second node; the second reset sub-circuit includes a fifth transistor, the gate electrode of which is connected to the first reset terminal to receive the first reset signal, the first electrode of which is connected to the second node, and the second electrode of which is connected to the first control node; the second node discharge sub-circuit includes a sixth transistor, a gate electrode and a first electrode of which are electrically connected to each other and configured to be both connected to the second node, and a second electrode of which is connected to the first reset terminal.

For example, in the shift register unit provided by an embodiment of the present disclosure, the output circuit includes a seventh transistor and a first storage capacitor. The gate electrode of the seventh transistor is connected to the first control node, the first electrode of the seventh transistor is connected to a clock signal terminal to receive a clock signal as the output signal, and the second electrode of the seventh transistor is connected to the output terminal; the first electrode of the first storage capacitor is connected to the first control node, and the second electrode of the first storage capacitor is connected to the output terminal.

For example, the shift register unit provided in an embodiment of the present disclosure further includes a first control circuit, a first control node noise reduction circuit, and an output noise reduction circuit. The first control circuit is configured to control the level of the second control node; the first control node noise reduction circuit is configured to reduce noise at the first control node under the control of the level of the second control node; the output noise reduction circuit is configured to reduce noise at the output terminal under the control of the level of the second control node.

For example, in the shift register unit provided by an embodiment of the present disclosure, the first control circuit includes an eighth transistor and a ninth transistor, the gate electrode and the first electrode of the eighth transistor are electrically connected to each other and configured to be both connected to a third voltage terminal to receive a third voltage, the second electrode of the eighth transistor is connected to the second control node, the gate electrode of the ninth transistor is connected to the first control node, the first electrode of the ninth transistor is connected to the second control node, and the second electrode of the ninth transistor is connected to the fourth voltage to receive the fourth voltage. The first control node noise reduction circuit includes a tenth transistor, a gate electrode of the tenth transistor is connected to the second control node, a first electrode of the tenth transistor is connected to the first control node, and a second electrode of the tenth transistor is connected to the fourth voltage terminal to receive the fourth voltage; the output noise reduction circuit includes an eleventh transistor, the gate electrode of which is connected to the second control node, the first electrode of which is connected to the output terminal, and the second electrode of which is connected to the fourth voltage terminal to receive the fourth voltage.

For example, the shift register unit provided by an embodiment of the present disclosure further includes a second reset circuit, and the second reset circuit is configured to reset the first control node in response to a second reset signal.

For example, in the shift register unit provided by an embodiment of the present disclosure, the second reset circuit includes a twelfth transistor, the gate electrode of the twelfth transistor and a second reset terminal are connected to receive the second reset signal, the first electrode of the twelfth transistor is connected to the first control node, and the second electrode and the fourth voltage terminal of the twelfth transistor are connected to receive a fourth voltage.

For example, the shift register unit provided by an embodiment of the present disclosure further includes a second control circuit configured to perform the second control on a second control node in response to the input signal.

For example, in the shift register unit provided in an embodiment of the present disclosure, the second control circuit includes a thirteenth transistor and a fourteenth transistor. The gate electrode of the thirteenth transistor is connected to the input terminal to receive the input signal, the first electrode of the thirteenth transistor is connected to the second control node, and the second electrode of the thirteenth transistor is connected to the fourth voltage terminal to receive a fourth voltage; the gate electrode of the fourteenth transistor is connected to a first reset terminal to receive the first reset signal, the first electrode of the fourteenth transistor is connected to the second control node, and the second electrode of the fourteenth transistor is connected to the fourth voltage terminal to receive the fourth voltage.

At least an embodiment of the present disclosure also provides a gate drive circuit including the shift register unit according to any embodiment of the present disclosure.

At least an embodiment of the present disclosure also provides a display device including the gate drive circuit described in an embodiment of the present disclosure.

At least an embodiment of the present disclosure also provides a driving method of the shift register unit, which comprises: a first stage, in which the input circuit performs the first control on the first control node and the first node in response to the input signal, and the output circuit outputs a low level of the output signal to the output terminal; a second stage, in which the input circuit performs the second control on the first node in response to the level of the first node, and the output circuit outputs the high level of the output signal to the output terminal; a third stage, in which the first reset circuit resets the first control node under the control of the first reset signal.

At least an embodiment of the present disclosure also provides a driving method of a shift register unit, which exchanges the input signal and the first reset signal with each other. The driving method includes: a first stage, in which the first reset circuit performs the first control on the first control node and the second node in response to the input signal, and the output circuit outputs a low level of the output signal to the output terminal; a second stage, in which the first reset circuit performs the second control on the second node in response to the level of the second node, and the output circuit outputs the high level of the output signal to the output terminal; a third stage, in which the input circuit resets the first control node under the control of the first reset signal.

At least an embodiment of the present disclosure also provides a driving method of a shift register unit, which includes: a first stage, in which the input circuit performs the first control on the first control node and the first node in response to the input signal, the second control circuit performs the second control on the level of the second control node in response to the input signal, and the output circuit outputs the low level of the output signal to the output terminal; a second stage, the input circuit performs the second control on the first node in response to the first level of the first node, and the output circuit outputs the high level of the output signal to the output terminal; a third stage, the first reset circuit resets the first control node under the control of the first reset signal, and the second control circuit performs the second control of the second control node in response to the first reset signal.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
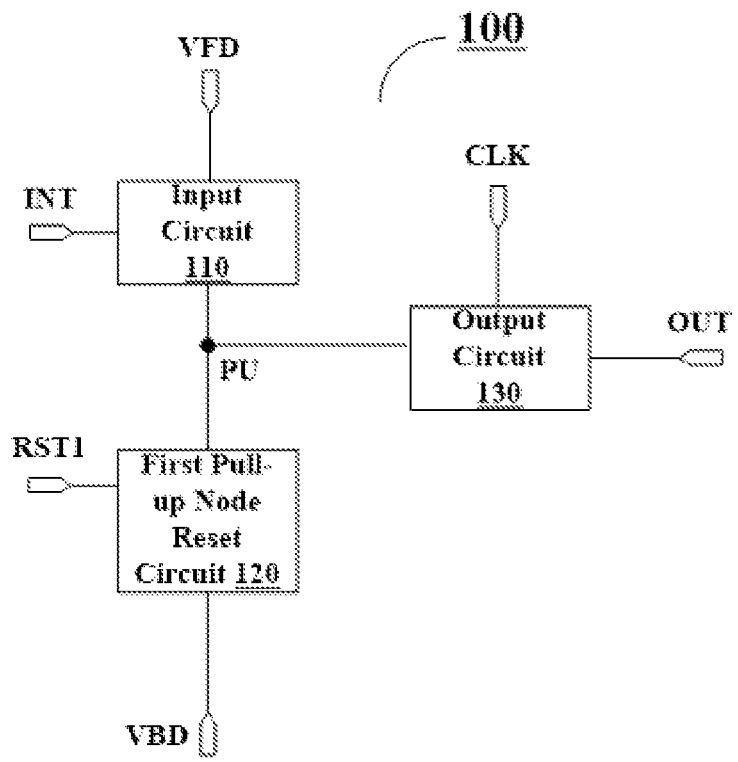
FIG. 1 is a schematic diagram of a shift register unit according to an embodiment of the present disclosure.

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

With more and more customers of related display panel products, the demands for display panel also become increasingly richer. Different customers have different requirements for the scanning mode of the display panel. For example, some customers need to put the panel upward and start scanning from the first line, while another group of customers want to put the panel upside down and start scanning from the last line. In order to meet the needs of customers, GOA circuits have gradually introduced the concept of bidirectional scanning. The so-called bidirectional scanning means that the display panel can start scanning from the first row (forward scanning) or from the penultimate row (reverse scanning) In this way, regardless of whether the display panel is placed upward or upside-down to match the whole machine, the display panel can finally display an upright image.

However, in the GOA circuit with bidirectional scanning function, the input transistors during forward scanning and the input transistor during reverse scanning are subjected to different stresses. The input transistor connected to the high voltage terminal is prone to negative shift of threshold voltage due to negative bias thermal stress (NBTS) for a long time. If the threshold voltage shifts in the negative direction, when the scanning direction is switched, the charged level of the pull-up node will be difficult to maintain due to leakage, thus causing the GOA circuit to have no output. If the GOA circuit uses an oxide transistor (for example, Indium Gallium Zinc Oxide (IGZO) as the active layer), the GOA circuit is more likely to have no output due to the instability of the oxide transistor itself.

An embodiment of the present disclosure provides a shift register unit including an input circuit, a first reset circuit and an output circuit. The input circuit includes an input terminal configured to perform a first control on a first control node and a first node in response to an input signal of the input terminal, and then perform a second control, which is different from the first control, on the first node under the control of the level of the first node, the first node is located in a path where the input signal incurs the first control on the first control node; the first reset circuit is configured to reset the first control node in response to the first reset signal; the output circuit is configured to output an output signal to the output terminal under the control of the level of the first control node. The embodiments of the present disclosure also provide a gate drive circuit, a display device and a driving method corresponding to the shift register unit.

According to the shift register unit, the gate drive circuit, the display device and the drive method provided by the embodiments of the disclosure, the phenomenon that the GOA circuit has no output after switching the scanning direction, due to negative bias of the threshold voltage of the transistor at the input end, can be avoided, the stability of the circuit is enhanced, and the threshold voltage bias margin of the transistor is increased.

Embodiments of the present disclosure and examples thereof will be described in detail below with reference to the accompanying drawings.

An embodiment of the present disclosure provides a shift register unit, for example, the shift register unit includes an input circuit, a first reset circuit, and an output circuit. FIG. 1 is a schematic diagram of a shift register unit according to an embodiment of the present disclosure. As illustrated in FIG. 1, the shift register unit 100 includes an input circuit 110, a first pull-up node reset circuit 120, and an output circuit 130. It should be noted that the first pull-up node reset circuit 120 is an example of the first reset circuit in the embodiment of the present disclosure, and the following description will take the first pull-up node reset circuit 120 as an example of the first reset circuit, but the embodiment of the present disclosure is not limited to this, and the following embodiments is the same as this structure and will not be described again.

Figure 2:
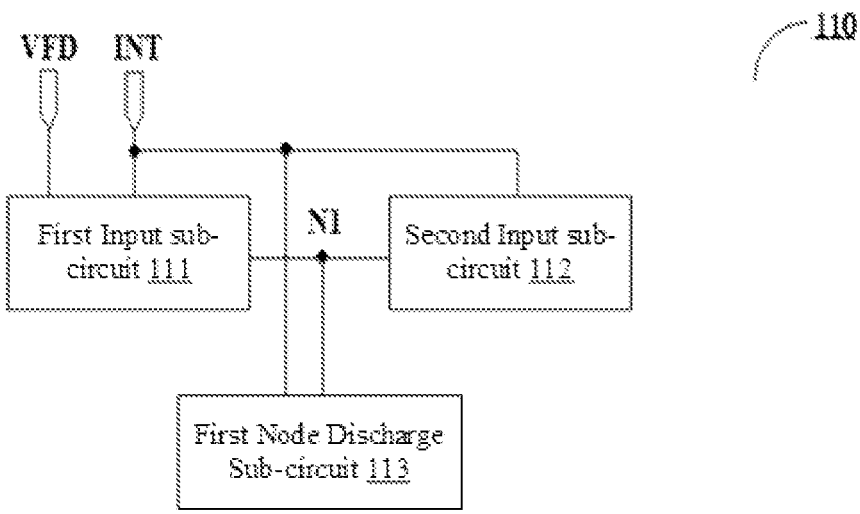
FIG. 2 is a schematic diagram of an example of the input circuit illustrated in FIG. 1.

The input circuit 110 includes an input terminal INT, and is configured to perform a first control (e.g., charging) on the first control node PU (e.g., pull-up node) and the first node N1 (as illustrated in FIG. 2) in response to an input signal of the input terminal INT, e.g., charge them to a first level (e.g., a high level), and then perform a second control (e.g., discharging), different from the first control, on the first node N1 under the control of the level of the first node N1, e.g., discharge it to a second level (e.g., a low level). For example, as illustrated in FIG. 2, the first node N1 is located in a path (e.g., a charging path for charging) in which an input signal performs a first control on the first control node PU. For example, the input circuit 110 is connected to the input terminal INT, the first control node PU and the first voltage terminal VFD, and is configured to electrically connect the first control node PU and the first voltage terminal VFD to receive a first voltage under the control of an input signal provided by the input terminal INT, so that the first voltage received by the first voltage terminal can charge (e.g., pull up) the first control node PU to increase the voltage of the first control node PU to a first level, thereby controlling the output circuit 230 to be in a on-state. It should be noted that the first voltage terminal VFD may be configured to maintain the input of a DC high level signal, for example, the DC high level signal may be referred to as the first voltage, so that the first control node PU may be charged. The following embodiments are the same as the above and will not be described again.

It should be noted that in the embodiments of the present disclosure, the first control is charging (e.g., pull-up) and the second control is discharging (e.g., pull-down), but the embodiments of the present disclosure are not limited to this, and the following embodiments are the same as this and will not be described again.

It should be noted that the first control node in the embodiments of the present disclosure includes a pull-up node, and the following description is conducted by taking the pull-up node as the example of the first control node. However, the embodiments of the present disclosure are not limited to this, and the following embodiments are the same as this and will not be described again.

The first pull-up node reset circuit 120 is configured to reset the pull-up node PU in response to the first reset signal. For example, the first pull-up node reset circuit 120 is configured to be connected to the first reset terminal RST1, so that the pull-up node PU can be electrically connected to the low-level signal or a low-voltage terminal under the control of the first reset signal input to the first reset terminal RST1, and thus pull-down reset can be performed at the pull-up node PU.

The output circuit 130 is configured to output a clock signal to the output terminal OUT as an output signal of the shift register unit 100, so as to drive, for example, a gate line connected to the output terminal OUT under the control of the level of the pull-up node PU. For example, the output circuit 130 is connected to the clock signal terminal CLK and the output terminal OUT, and is configured to be turned on under the control of the level of the pull-up node PU so as to electrically connect the clock signal terminal CLK and the output terminal OUT, so that the clock signal input by the clock signal terminal CLK can be output to the output terminal OUT.

FIG. 2 is a schematic diagram of an example of an input circuit of the shift register unit illustrated in FIG. 1. As illustrated in FIG. 2, the input circuit 110 includes a first input sub-circuit 111, a second input sub-circuit 112, and a first node discharge sub-circuit 113.

The first input sub-circuit 111 is configured to perform a first control on the first node N1 in response to an input signal. For example, the first input sub-circuit 111 is connected to the input terminal INT, the first node N1, and the first voltage terminal VFD, and is configured to connect the first node N1 and the first voltage terminal VFD under the control of the input signal provided by the input terminal INT, so that the high level signal (i.e., the first voltage) received by the first voltage terminal VFD can charge the first node N1 to the first level.

The second input sub-circuit 112 is configured to perform a first control of the pull-up node PU in response to an input signal. For example, the second input sub-circuit 112 is connected to the input terminal INT, the pull-up node PU and the first node N1, and is configured to electrically connect the first node N1 and the pull-up node PU under the control of the input signal provided by the input terminal INT, so that the high level signal of the first node N1 can charge the pull-up node PU to the first level.

The first node discharge sub-circuit 113 is configured to perform a second control on the first node N1 under the control of the first level of the first node N1. For example, the first node discharge sub-circuit 113 may be connected to the input terminal INT and the first node N1, and configured to electrically connect the first node N1 and the input terminal INT under the control of the first level of the first node N1 (at this time, the input terminal INT is in a low voltage state), so that the first node N1 can be discharged to the second level. For example, when the input signal provided by the input terminal INT changes from the high level to the low level, the first node N1 is discharged through coupling effect. For example, when the input signal provided by the input terminal INT remains at the low level in a subsequent stage, because the first voltage terminal VFD remains to input the high level, the transistor of the first input sub-circuit 111 is at the risk of negative bias, and the potential of the first node N1 may be charged to a high level. In this case, the first node N1 can be discharged to a low level through the first node discharge sub-circuit 113 and the input terminal INT. In this way, the transistor in the second input sub-circuit 120 can maintain a zero bias state, thereby eliminating the risk of threshold voltage deviation and preventing the pull-up node PU from forming a leakage path, so as to avoid the phenomenon of no output after the GOA circuit switches the scanning direction.

Figure 3:
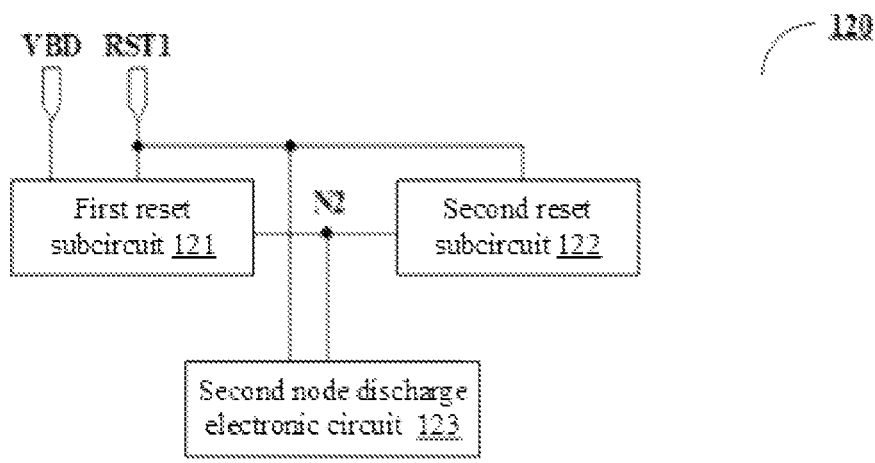
FIG. 3 is a schematic diagram of an example of the first pull-up node reset circuit illustrated in FIG. 1.

FIG. 3 is a schematic diagram of an example of a first pull-up node reset circuit of the shift register unit illustrated in FIG. 1. For example, the first pull-up node reset circuit 120 includes a first reset terminal RST1, and the first pull-up node reset circuit 120 is further configured to perform a second control on the second node N2 under the control of the level of the second node N2, for example, the second node N2 is located in a path (e.g., a discharge path) where the first reset signal performs a second control on the first control node PU. More specifically, as illustrated in FIG. 3, the first pull-up node reset circuit 120 includes a first reset sub-circuit 121, a second reset sub-circuit 122, and a second node discharge sub-circuit 123.

The first reset sub-circuit 121 is configured to reset the second node N2 in response to the first reset signal. For example, the first reset sub-circuit 121 is connected to the first reset terminal RST1 and the second voltage terminal VBD, and is configured to electrically connect the second node N2 and the second voltage terminal VBD under the control of the first reset signal provided by the first reset terminal RST1, so that the second node N2 can be reset. For example, the second voltage terminal VBD can be configured to keep the input of a DC low level signal, and the DC low level is referred to as the second voltage. For example, the second voltage is smaller than the first voltage, so that the second node N2 can be reset. The following embodiments are the same as the above and will not be described again.

The second reset sub-circuit 122 is configured to reset the pull-up node PU in response to the first reset signal. For example, the second reset sub-circuit 122 is connected to the first reset terminal RST1, the pull-up node PU and the second node N2, and is configured to electrically connect the second node N2 and the pull-up node PU under the control of the first reset signal provided by the first reset terminal RST1, so that the low level signal of the second node N2 can reset the pull-up node PU.

The second node discharge sub-circuit 123 is configured to perform a second control on the second node N2 under the control of the level of the second node N2. For example, the second node discharge sub-circuit 123 is connected to the first reset terminal RST1 and the second node N2, and is configured to electrically connect the second node N2 and the first reset terminal RST1 under the control of the level of the second node N2, so that the second node N2 can be discharged.

In this embodiment, the first pull-up node reset circuit 120 is arranged symmetrically with the input circuit 110, so the shift register unit can be used for bidirectional scanning. When the display panel having the shift register unit 100 performs forward scanning (i.e., the input signal is provided to the input terminal INT and the first reset terminal RST1 provides the first reset signal), its operation is as described above, while when the display panel having the shift register unit 100 performs reverse scanning (i.e., the input signal is provided to the first reset terminal RST1 and the first reset signal is provided to the input terminal INT), the first reset sub-circuit 121 can charge the second node N2 in response to the input signal provided by the first reset terminal RST1, the second reset sub-circuit 122 can charge the pull-up node PU in response to the input signal provided by the first reset terminal RST1, and the second node discharge sub-circuit 123 can discharge the second node N2 under the control of the level of the second node N2; for example, when the input signal provided by the first reset terminal RST1 changes from a high level to a low level, the second node N2 is discharged through coupling effect. For example, in a subsequent stage, when the input signal provided by the first reset terminal RST1 remains at a low level, because the second voltage terminal VBD remains at an input high level, the transistor of the first reset sub-circuit 121 is at the risk of negative bias, and the potential of the second node N2 can be charged to a high level. In this case, the second node N2 can also be discharged to a low level through the second node discharge sub-circuit 123 and the first reset terminal RST1, so that the transistor in the second reset sub-circuit 122 maintains a zero bias state, thereby eliminating the risk of threshold voltage bias, preventing the pull-up node PU from forming a leakage path, and avoiding the phenomenon of no output after the GOA circuit switches the scanning direction.

Figure 4A:
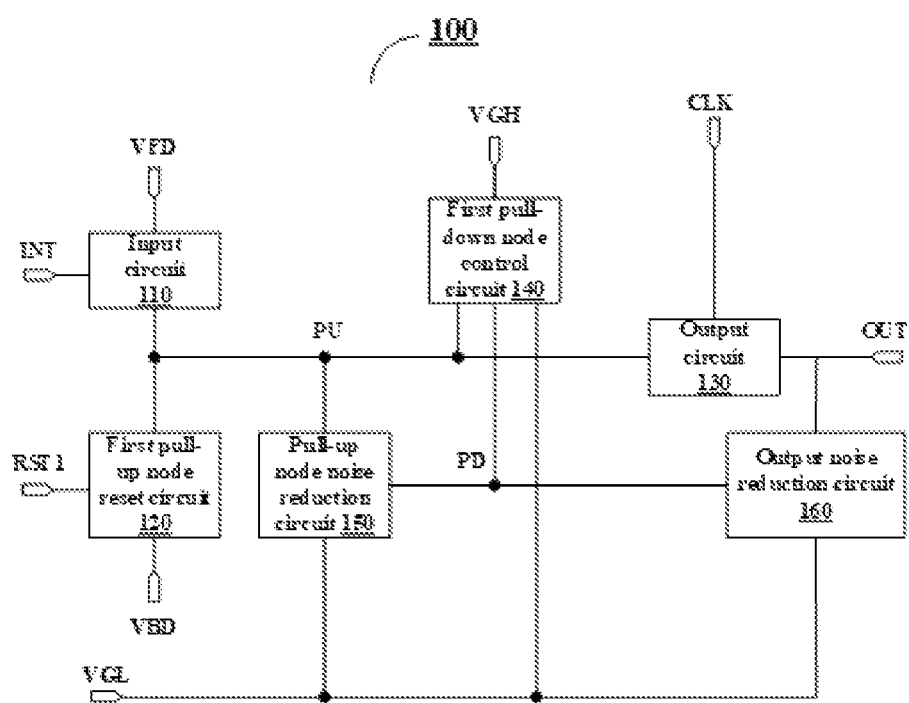
FIG. 4A is a schematic diagram of another shift register unit according to an embodiment of the present disclosure.

For example, the shift register unit may further include a first control circuit, a first control node noise reduction circuit, and an output noise reduction circuit. FIG. 4A is a schematic diagram of another shift register unit according to an embodiment of the present disclosure. As illustrated in FIG. 4A, on the basis of the example illustrated in FIG. 1, the shift register unit 100 may further include a first pull-down node control circuit 140, a pull-up node noise reduction circuit 150, and an output noise reduction circuit 160. Other structures are the same as the shift register unit 100 illustrated in FIG. 1 and will not be described here. It should be noted that in the embodiments of the present disclosure, the first pull-down node control circuit 140 is an example of the first control circuit, and the pull-up node noise reduction circuit 150 is an example of the first control node noise reduction circuit. The following description will take the first pull-down node control circuit 140 as an example of the first control circuit and the pull-up node noise reduction circuit 150 as an example of the first control node noise reduction circuit, but the embodiments of the present disclosure are not limited to this, and the following embodiments are the same as this and will not be described again.

The first pull-down node control circuit 140 is configured to control the level of the second control node PD (e.g., pull-down node) under the control of the level of the pull-up node PU. For example, the first pull-down node control circuit 140 is connected with the third voltage terminal VGH, the fourth voltage terminal VGL, the pull-up node PU, and the second control node PD, so as to electrically connect the second control node PD and the fourth voltage terminal VGL under the control of the level of the pull-up node PU, thereby performing pull-down control on the level of the second control node PD to enable the second control node PD at a low level. Meanwhile, the first pull-down node control circuit 140 can electrically connect the second control node PD and the third voltage terminal under the control of the third voltage provided by the third voltage terminal VGH, thereby charging the second control node PD. It should be noted that the third voltage terminal VGH may be configured to keep the input of a DC high level signal, for example, the DC high level signal may be referred to as the third voltage; the fourth voltage terminal VGL may be configured to keep the input of a DC low level signal, for example, the DC low level signal may be referred to as the fourth voltage, and the fourth voltage may be lower than the third voltage, for example, the third voltage and the first voltage are the same, and the fourth voltage and the second voltage are the same. The following embodiments are the same and will not be described again.

It should be noted that the second control node in the embodiments of the present disclosure includes a pull-down node, and the following pull-down node will be described as an example of the second control node, but the embodiments of the present disclosure are not limited to this, and the following embodiments are the same as this and will not be described again.

The pull-up node noise reduction circuit 150 is configured to reduce the noise of the pull-up node PU under the control of the level of the pull-down node PD. For example, the pull-up node noise reduction circuit 150 is configured to be connected to the fourth voltage terminal VGL, the pull-up node PU, and the pull-down node PD, to electrically connect the pull-up node PU and the fourth voltage terminal VGL under the control of the level of the pull-down node PD, thereby performing pull-down noise reduction on the pull-up node PU.

The output noise reduction circuit 160 is configured to reduce noise at the output terminal OUT under the control of the level of the pull-down node PD. For example, the output noise reduction circuit 160 is configured to be connected to the fourth voltage terminal VGL, the output terminal OUT, and the pull-down node PD, to electrically connect the output terminal OUT and the fourth voltage terminal VGL under the control of the level of the pull-down node PD, thereby performing pull-down noise reduction on the output terminal OUT.

It should be noted that in this embodiment, the input circuit 110 is connected to the first voltage terminal VFD, and the first pull-up node reset circuit 120 is connected to the second voltage terminal VBD. For example, the output signals of the first voltage terminal VFD and the second voltage terminal VBD can be switched between a high level and a low level as required. For example, when the input terminal INT of the input circuit 110 provides an input signal and the first reset terminal RST1 of the first pull-up node reset circuit 120 provides a first reset signal, the first voltage terminal VFD may be configured to keep the input of a DC high level signal and the second voltage terminal VBD may be configured to keep the input of a DC low level signal; when the input terminal INT of the input circuit 110 provides the first reset signal and the first reset terminal RST1 of the first pull-up node reset circuit 120 provides the input signal, the first voltage terminal VFD can be switched to maintain the input of a DC low level signal and the second voltage terminal VBD can be switched to maintain the input of a DC high level signal. The following embodiments are the same and will not be described again.

Figure 4B:
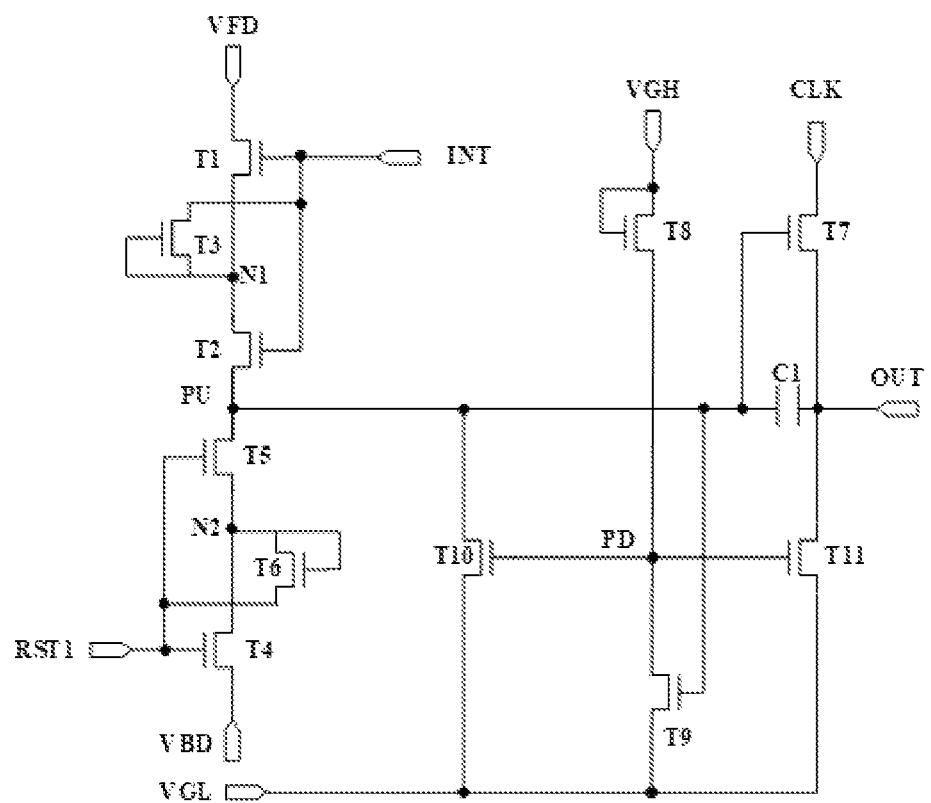
FIG. 4B is a circuit schematic diagram of an example of the shift register unit illustrated in FIG. 4A.

For example, the shift register unit 100 illustrated in FIG. 4A may be embodied as the circuit structure illustrated in FIG. 4B in one example. In the following description, each transistor is illustrated as an N-type transistor, but it is not a limitation to the embodiments of the present disclosure. As illustrated in FIG. 4B, the shift register unit 100 includes first to eleventh transistors T1-T11 and further includes a first storage capacitor C1.

For example, the input circuit 110 includes a first input sub-circuit 111, a second input sub-circuit 112, and a first node discharge sub-circuit 113. As illustrated in FIG. 4B, the first input sub-circuit 111 may be implemented as a first transistor T1. The gate electrode of the first transistor T1 is configured to be connected to the input terminal INT to receive an input signal, the first electrode of the first transistor T1 is configured to be connected to the first voltage terminal VFD to receive a first voltage, and the second electrode of the first transistor T1 is configured to be connected to the first node N1, so when the first transistor T1 is turned on due to the conduction signal (high level signal) received by the input terminal INT, the first voltage provided by the first voltage terminal VFD is used to charge the first node N1 to a first level, that is, a high level. The second input sub-circuit 112 may be implemented as a second transistor T2. The gate electrode of the second transistor T2 is configured to be connected to the input terminal INT to receive an input signal, the first electrode of the second transistor T2 is configured to be connected to the first node N1, and the second electrode of the second transistor T2 is configured to be connected to the pull-up node PU, so when the second transistor T2 is turned on due to the conduction signal (high level signal) received by the input terminal INT, the high level of the first node N1 is used to charge the pull-up node PU to a first level, that is, a high level. The first node discharge sub-circuit 113 may be implemented as a third transistor T3. The gate electrode and the first electrode of the third transistor T3 are electrically connected to each other and are configured to be both connected to the first node N1, and the second electrode of the third transistor T3 is connected to a second control path (e.g., a discharge path). For example, the discharge path is, for example, an input terminal. For example, when the input signal provided by the input terminal INT changes from a high level to a low level, the potential of the first node N1 decreases due to coupling effect, for example, due to parasitic capacitive coupling effect of the transistor. For example, in a subsequent stage, when the input signal provided by the input terminal INT is kept at a low level, the first transistor T1 is at the risk of negative bias and the potential of the first node N1 may be charged to a high level because the first voltage terminal VFD is kept at an input high level. In this case, the third transistor T3 is turned on due to the conduction level (high level) of the first node N1, discharges the high level of the first node N1 through the input terminal INT and enables the first node N1 to be at a low level, which can keep the second transistor T2 in a zero bias state (both the first electrode and the second electrode are at a low level) in subsequent stages, thus eliminating the risk of threshold voltage deviation and preventing the pull-up node PU from forming a leakage path.

When the input signal provided by the input terminal INT is at an effective level (e.g., high level), both the first transistor T1 and the second transistor T2 are turned on, so that the first voltage of the first voltage terminal VFD charges the first node N1 and the pull-up node PU to be at a first level, i.e., high level. For example, the first voltage terminal VFD is now configured to maintain the input of a DC high level signal. After the charging is completed, when the input signal provided by the input terminal changes from an effective level to an ineffective level (e.g., low level), the level of the first node N1 becomes low due to the coupling effect, and at the same time, the input terminal INT maintains to provide a low level signal in a subsequent stage. Because the first voltage terminal VFD maintains the input high level, the first transistor T1 has the risk of negative bias, and the potential of the first node N1 may be charged to a high level. In this case, the third transistor T3 is turned on, thereby electrically connecting the first node N1 and the input terminal INT to discharge the first node N1 and control the first node at a second level, that is, a low level. In this way, the second transistor T2 can maintain a zero bias state, thereby eliminating the risk of threshold voltage bias and preventing the pull-up node PU from forming a leakage path, so as to avoid the phenomenon of no output after the GOA circuit switches the scanning direction.

For example, the first pull-up node reset circuit 120 includes a first reset sub-circuit 121, a second reset sub-circuit 122, and a second node discharge sub-circuit 123. As illustrated in FIG. 4B, the first reset sub-circuit 121 may be implemented as a fourth transistor T4. The gate electrode of the fourth transistor T4 is configured to be connected to the first reset terminal RST1 to receive the first reset signal, the first electrode of the fourth transistor T4 is configured to be connected to the second voltage terminal VBD to receive the second voltage, and the second electrode of the fourth transistor T4 is configured to be connected to the second node N2. The second reset sub-circuit 122 may be implemented as a fifth transistor T5. The gate electrode of the fifth transistor T5 is configured to be connected to the first reset terminal RST1 to receive the first reset signal, the first electrode of the fifth transistor T5 is configured to be connected to the second node N2, and the second electrode of the fifth transistor T5 is configured to be connected to the pull-up node PU. The second node discharge sub-circuit 123 may be implemented as a sixth transistor T6. The gate electrode and the first electrode of the sixth transistor T6 are electrically connected to each other and are configured to be both connected to the second node N2, and the second electrode of the sixth transistor T6 is connected to the first reset terminal RST1.

When the first reset signal provided by the first reset terminal RST1 is at an effective level, the fourth transistor T4 and the fifth transistor T5 are both turned on to electrically connect the pull-up node PU and the second voltage terminal VBD, so that the pull-up node PU can be reset to decrease from a high level to a low level. For example, the second voltage terminal VBD is now configured to keep the input of a DC low level signal. When performing reverse scanning, the first reset terminal RST1 provides an input signal, and the second voltage terminal VBD is switched to provide a DC high level signal to charge the second node N2 and the pull-up node PU. After the charging is completed, the input signal of the first reset terminal changes from an effective level to an ineffective level, the level of the second node N2 decreases due to the coupling effect; at the same time, the first reset terminal RST1 maintains to provide a low level signal in a subsequent stage. Because the second voltage terminal VBD maintains the input high level, the fourth transistor T4 is at a risk of negative bias, and the potential of the second node N2 may be charged to a high level. In this case, the sixth transistor T6 is turned on under the control of the level of the second node N2, thereby electrically connecting the second node N2 and the first reset terminal RST1 to discharge the second node N2 and control the second node N2 at the second level, that is, the low level. In this way, the fifth transistor T5 can maintain a zero bias state, thereby eliminating the risk of threshold voltage bias and preventing the pull-up node PU from forming a leakage path, so as to avoid the phenomenon of no output after the GOA circuit switches the scanning direction.

The output circuit 130 may be implemented as a seventh transistor T7 and a first storage capacitor C1. The gate electrode of the seventh transistor T7 is configured to be connected to the pull-up node PU, the first electrode of the seventh transistor T7 is configured to be connected to the clock signal terminal CLK to receive the clock signal, and the second electrode of the seventh transistor T7 is configured to be connected to the output terminal OUT. The first electrode of the first storage capacitor C1 is configured to be connected to the gate electrode of the seventh transistor T7, and the second electrode of the first storage capacitor C1 is configured to be connected to the second electrode of the seventh transistor T7. When the level of the pull-up node PU is at an effective level, the seventh transistor T7 is turned on, thereby outputting a clock signal to the output terminal OUT; the first storage capacitor C1 has a bootstrap function, which is beneficial to better output the high level in the clock signal.

The first pull-down node control circuit 140 may be implemented as an eighth transistor T8 and a ninth transistor T9. The gate electrode and the first electrode of the eighth transistor T8 are electrically connected to each other and are configured to be both connected to the third voltage terminal VGH to receive the third voltage, and the second electrode of the eighth transistor T8 is connected to the pull-down node PD. The gate electrode of the ninth transistor T9 is connected to the pull-up node PU, the first electrode of the ninth transistor T9 is connected to the pull-down node PD, and the second electrode of the ninth transistor T9 is connected to the fourth voltage terminal VGL to receive the fourth voltage.

For example, the eighth transistor T8 is always in an on-state in response to the third voltage supplied from the third voltage terminal VGH, and when the ninth transistor T9 is turned off, the level of the pull-up node PU is controlled at a third voltage, that is, a high level. The parameters of the ninth transistor T9 and the eighth transistor T8 (including the channel aspect ratio or on resistance) are designed to allow that when the ninth transistor T9 is turned on under the control of the level of the pull-up node PU, the voltage of the pull-down node PD can be pulled down to the fourth voltage. The following embodiments are the same as the above and will not be described again.

The pull-up node noise reduction circuit 150 may be implemented as a tenth transistor T10. The gate electrode of the tenth transistor T10 is connected to the pull-down node PD, the first electrode of the tenth transistor T10 is connected to the pull-up node PU, and the second electrode and the fourth voltage terminal VGL of the tenth transistor T10 are connected to receive the fourth voltage. The tenth transistor T10 is turned on when the pull-down node PD is at an effective level, and the pull-up node PU and the fourth voltage terminal VGL are electrically connected, so that the pull-up node PU can be pulled down to the fourth voltage to realize noise reduction.

The output noise reduction circuit 160 may be implemented as an eleventh transistor T11. The gate electrode of the eleventh transistor T11 is connected to the pull-down node PD, the first electrode of the eleventh transistor T11 is connected to the output terminal OUT, and the second electrode and the fourth voltage terminal VGL of the eleventh transistor T11 are connected to receive the fourth voltage. The eleventh transistor T11 is turned on when the pull-down node PD is at an effective level, electrically connecting the output terminal OUT and the fourth voltage terminal VGL, so that noise can be reduced at the output terminal OUT.

Figure 5A:
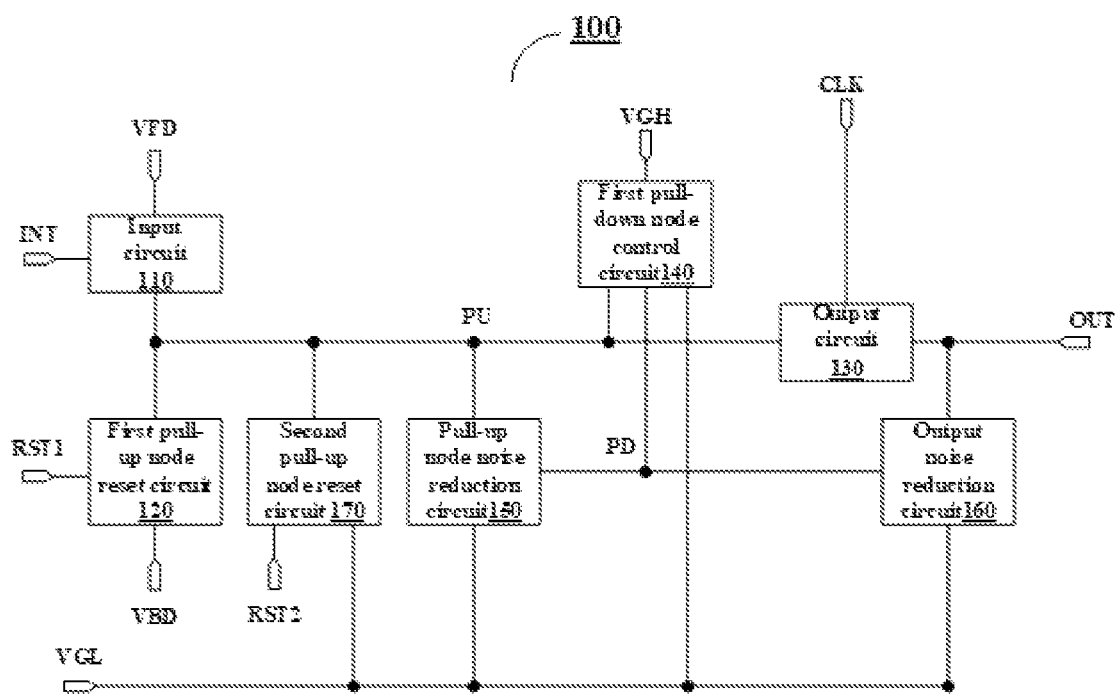
FIG. 5A is a schematic diagram of another shift register unit according to an embodiment of the present disclosure.

For example, the shift register unit may further include a second reset circuit. FIG. 5A is a schematic diagram of another shift register unit according to an embodiment of the present disclosure. As illustrated in FIG. 5A, based on the example as illustrated in FIG. 4A, the shift register unit 100 may further include a second pull-up node reset circuit 170, other structures are similar to those in the shift register unit 100 illustrated in FIG. 4A and will not be described here. It should be noted that the second pull-up node reset circuit 170 in the embodiments of the present disclosure is an example of the second reset circuit, and the following description will take the second pull-up node reset circuit 170 as an example of the second reset circuit, but the embodiment of the present disclosure is not limited to this, and the following embodiment is the same as this and will not be described again.

The second pull-up node reset circuit 170 is configured to reset the pull-up node PU in response to the second reset signal. For example, the second pull-up node reset circuit 170 is connected to the second reset terminal RST2, the pull-up node PU and the fourth voltage terminal VGL so as to electrically connect the pull-up node PU and the fourth voltage terminal VGL under the control of the second reset signal provided by the second reset terminal RST2, so that the pull-up node PU can be reset. For example, the second reset signal is a total reset signal, and the second pull-up node reset circuit 170 can reset the pull-up nodes PU of all cascaded shift register units under the control of the second reset signal after the scanning of one frame of image is completed.

Figure 5B:
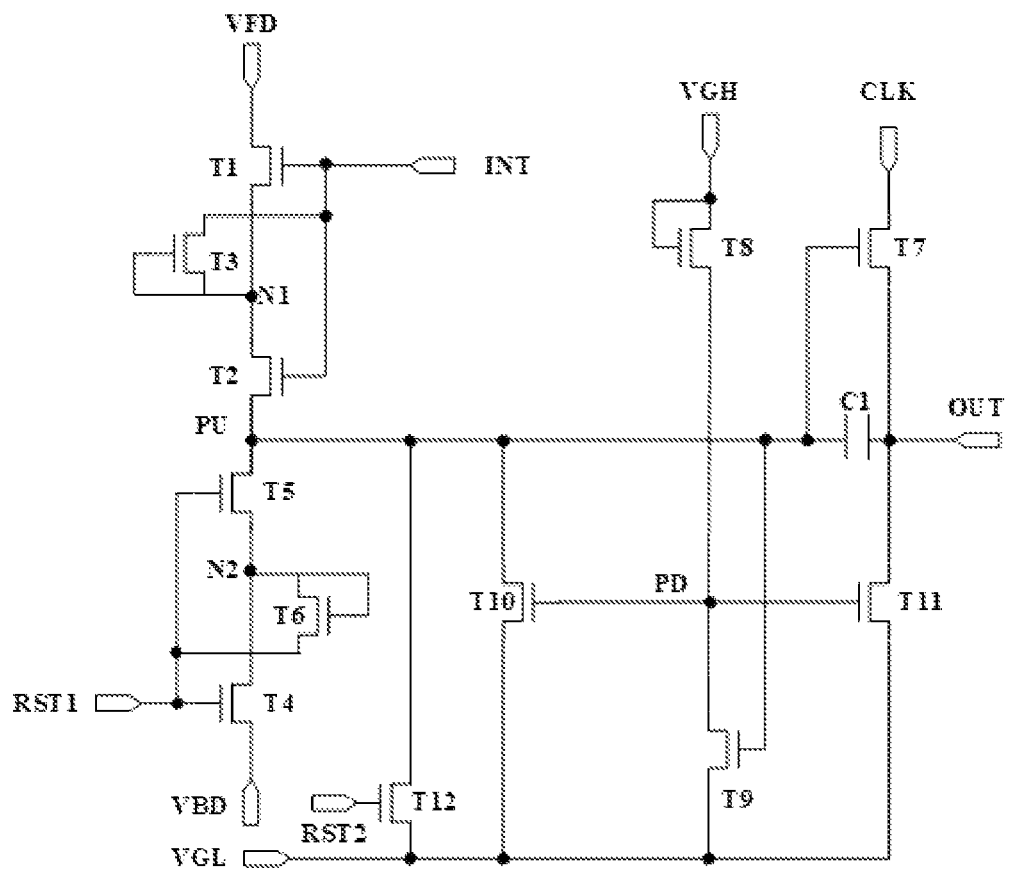
FIG. 5B is a circuit schematic diagram of an example of the shift register unit illustrated in FIG. 5A.

For example, the shift register unit 100 illustrated in FIG. 5A may be embodied as the circuit structure illustrated in FIG. 5B in one example. As illustrated in FIG. 5B, the shift register unit 100 in this embodiment is similar to the shift register unit 100 described in FIG. 4B except that the twelfth transistor T12 is further included.

In this embodiment, the second pull-up node reset circuit 170 may be implemented as a twelfth transistor T12. The gate electrode of the twelfth transistor T12 is connected to the second reset terminal RST2 to receive the second reset signal, the first electrode of the twelfth transistor T2 is connected to the pull-up node PU, and the second electrode of the twelfth transistor T12 is connected to the fourth voltage terminal VGL to receive the fourth voltage. The twelfth transistor T12 is turned on when the second reset signal is at an effective level (e.g., high level), and the pull-up node PU and the fourth voltage terminal VGL are electrically connected, so that the pull-up node PU can be reset.

Figure 6A:
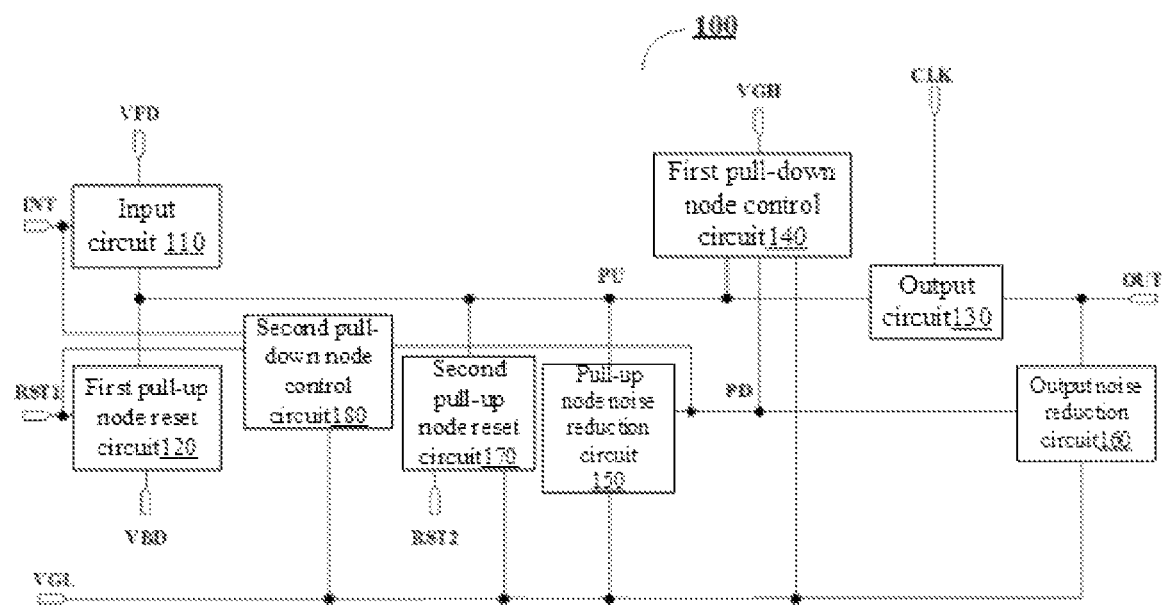
FIG. 6A is a schematic diagram of another shift register unit according to an embodiment of the present disclosure.

For example, the shift register unit further includes a second control circuit. FIG. 6A is a schematic diagram of another shift register unit according to an embodiment of the present disclosure. As illustrated in FIG. 6A, on the basis of the example illustrated in FIG. 5A, the shift register unit 100 may further include a second pull-down node control circuit 180, other structures are similar to those of the shift register unit 100 as illustrated in FIG. 5A and will not be described here. It should be noted that the second pull-down node control circuit 180 in the embodiment of the present disclosure is an example of the second control circuit. The following description will take the second pull-down node control circuit 180 as an example of the second control circuit, but the embodiments of the present disclosure are not limited to this. The following embodiments are the same as this and will not be described again.

The second pull-down node control circuit 180 is configured to perform a second control on the pull-down node PD in response to an input signal. For example, the second pull-down node control circuit 180 is connected to the input terminal INT, the first reset terminal RST1, the pull-down node PD and the fourth voltage terminal VGL so as to electrically connect the pull-down node PD and the fourth voltage terminal VGL under the control of the input signal input from the input terminal INT (during forward scanning) or the input signal provided by the first reset terminal RST1 (during reverse scanning), so that the pull-down node PD can be discharged (e.g., discharged to a second level) at the input stage, thereby fully ensuring that the pull-up node is not affected by the pull-down node PD during charging.

Figure 6B:
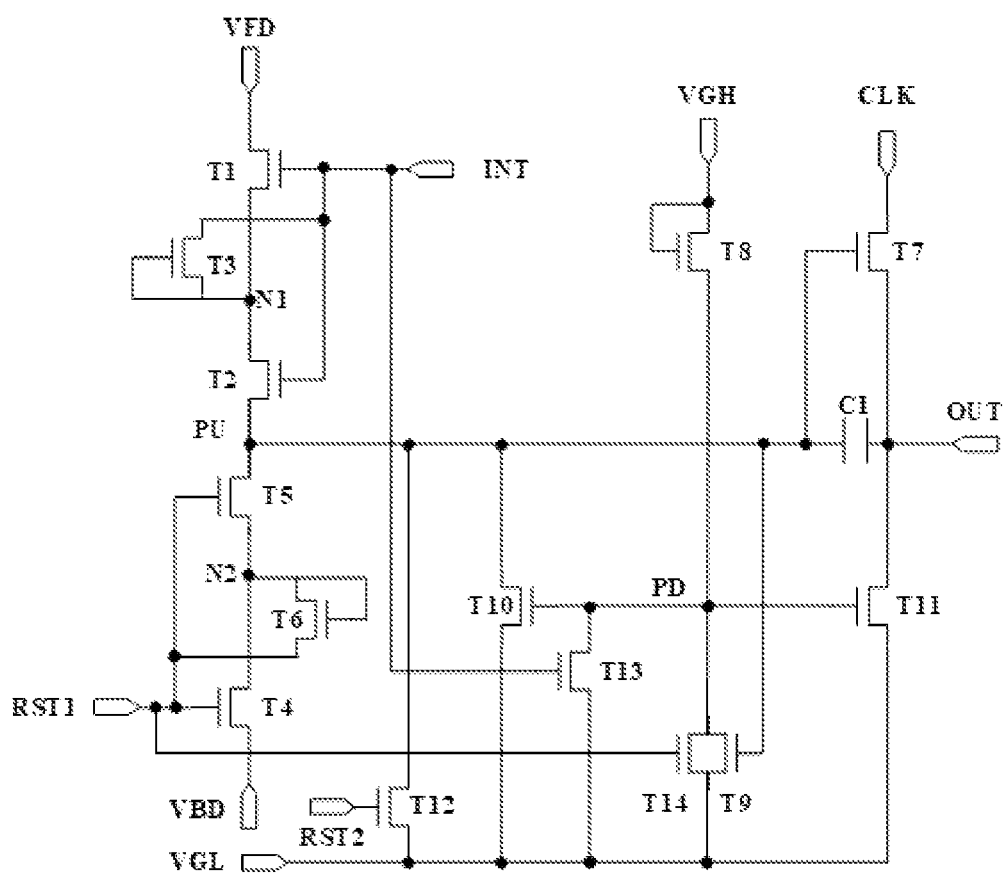
FIG. 6B is a circuit schematic diagram of an example of the shift register unit illustrated in FIG. 6A.

For example, the shift register unit 100 illustrated in FIG. 6A may be embodied as the circuit structure illustrated in FIG. 6B in one example. As illustrated in FIG. 6B, the structure of the shift register unit 100 in this embodiment is similar to that of the shift register unit 100 described in FIG. 5B, except that a thirteenth transistor T13 and a fourteenth transistor T14 are further included.

In this embodiment, the second pull-down node control circuit 180 may be implemented as a thirteenth transistor T13 and a fourteenth transistor T14. The gate electrode of the thirteenth transistor T13 is connected to the input terminal INT to receive an input signal, the first electrode of the thirteenth transistor T13 is connected to the pull-down node PD, and the second electrode of the thirteenth transistor T13 is connected to the fourth voltage terminal VGL to receive a fourth voltage. The gate electrode of the fourteenth transistor T14 is connected to the first reset terminal RST1 to receive the first reset signal, the first electrode of the fourteenth transistor T14 is connected to the pull-down node PD, and the second electrode of the fourteenth transistor T14 is connected to the fourth voltage terminal VGL to receive the fourth voltage.

For example, during forward scanning, the thirteenth transistor T13 is turned on when the input signal provided by the input terminal INT is an effective level, electrically connecting the pull-down node PD and the fourth voltage terminal VGL, thereby discharging the pull-down node PD; the fourteenth transistor T14 is turned on when the first reset signal provided by the first reset terminal RST1 is at an effective level, electrically connecting the pull-down node PD and the fourth voltage terminal VGL, so that the pull-down node PD can be discharged. For example, during reverse scanning, the fourteenth transistor T14 is turned on when the input signal provided by the first reset terminal RST1 is an effective level, electrically connecting the pull-down node PD and the fourth voltage terminal VGL, thereby discharging the pull-down node PD; the thirteenth transistor T13 is turned on when the first reset signal supplied from the input terminal INT is at an effective level, electrically connecting the pull-down node PD and the fourth voltage terminal VGL, so that the pull-down node PD can be discharged.

It should be noted that in the description of the various embodiments of the present disclosure, the pull-up node PU, the pull-down node PD, the first node N1 and the second node N2 may be not necessarily represent actual components, but represent the junction points of related electrical connections in the circuit diagram.

It should be noted that the transistors used in the embodiments of the present disclosure can be thin film transistors, field effect transistors, or other switching devices with the same characteristics, and the embodiments of the present disclosure are all described with thin film transistors as examples. The source electrode and the drain electrode of the transistor used here can be symmetrical in structure, so the source electrode and the drain electrode can be structurally indistinguishable. In the embodiment of the present disclosure, in order to distinguish the two electrodes of the transistor except the gate, electrode one electrode is directly described as the first electrode and the other electrode is described as the second electrode.

In addition, the transistors in the embodiments of the present disclosure are all described by taking N-type transistors as examples, in which the first electrode of the transistor is a drain electrode and the second electrode is a source electrode. It should be noted that this disclosure includes, but is not limited to, this case. For example, one or more transistors in the shift register unit 100 provided by the embodiments of the present disclosure may also adopt P-type transistors. In this case, the first electrode of the transistor is the source electrode and the second electrode is the drain electrode, and all the modifications that are required are to connect the electrodes of the selected type of transistors with reference to the electrodes of the corresponding transistors in the embodiments of the present disclosure. When N-type transistors are used, Indium Gallium Zinc Oxide (IGZO) can be used as the active layers of the thin film transistors. Compared with low temperature poly-silicon (LTPS) or amorphous silicon (such as hydrogenated amorphous silicon) being used as the active layers of a thin film transistor, the size of the transistor can be effectively reduced and the leakage current can be prevented.

In the embodiment of the present disclosure, for example, when each circuit is implemented as an N-type transistor, the term "pull-up" means charging a node or an electrode of a transistor so as to raise the absolute value of the level of the node or the electrode, thereby realizing the operation (e.g., turn-on) of the corresponding transistor; "pull-down" refers to discharging a node or an electrode of a transistor so that the absolute value of the level of the node or the electrode decreases, thereby realizing the operation (e.g., turn-off) of the corresponding transistor. For another example, when each circuit is implemented as a P-type transistor, the term "pull-up" means discharging a node or an electrode of a transistor so that the absolute value of the level of the node or the electrode decreases, thereby realizing the operation (e.g., turn-on) of the corresponding transistor; "pull-down" means to charge a node or an electrode of a transistor so that the absolute value of the level of the node or the electrode increases, thereby realizing the operation (e.g., turn-off) of the corresponding transistor.

Figure 7:
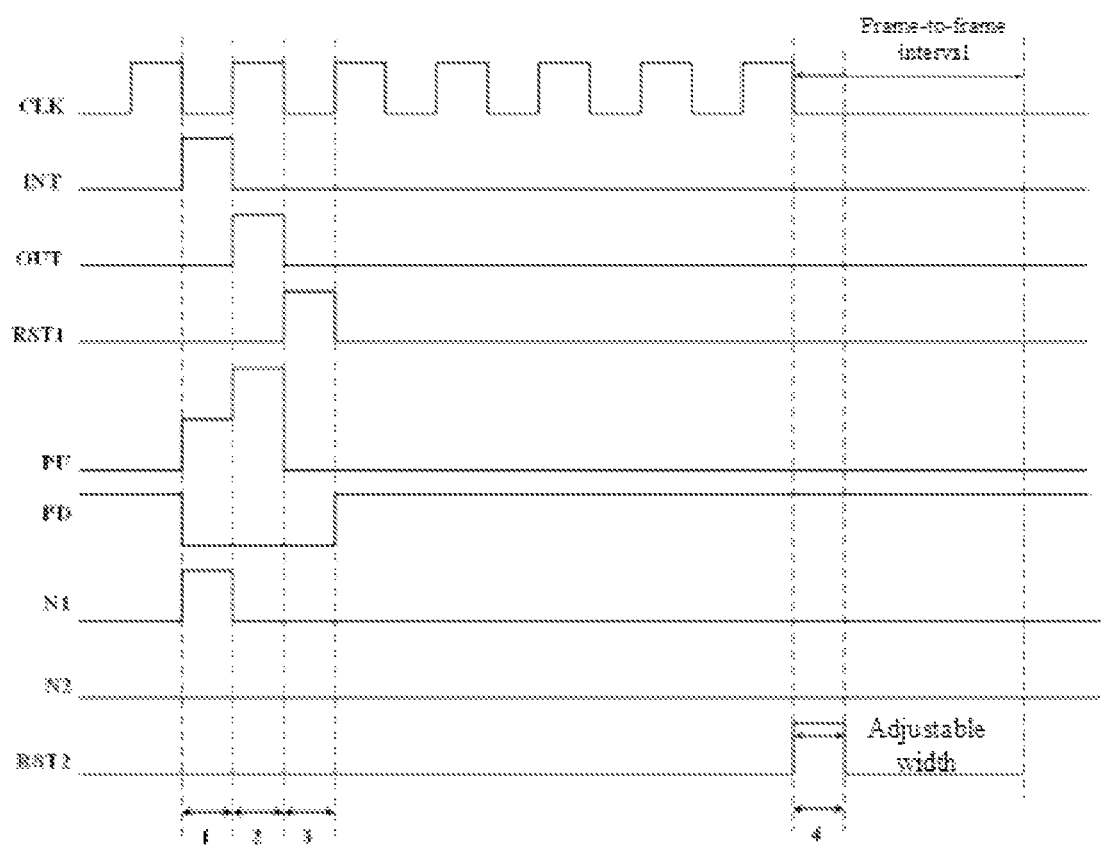
FIG. 7 is a signal timing diagram when a shift register unit operates according to an embodiment of the present disclosure.

FIG. 7 is a signal timing diagram of a shift register unit during operation according to an embodiment of the present disclosure. The operation principle of the shift register unit 100 illustrated in FIG. 6B will be described below with reference to the signal timing chart illustrated in FIG. 7, and each transistor is an N-type transistor as an example, but the embodiments of the present disclosure are not limited thereto. In the four stages, i.e., the first stage 1, the second Stage 2, the third stage 3, and the fourth stage 4, as illustrated in FIG. 7, the shift register unit 100 can respectively perform the following operations.

In the first stage 1 (i.e., the input stage), the input terminal INT provides a high level signal, the first voltage terminal VFD is configured to provide a DC high level signal, the first transistor T1 and the second transistor T2 are turned on in response to the high level signal provided by the input terminal INT, and the first node N1 and the pull-up node PU are charged to a first level; the seventh transistor T7 is turned on in response to the first level of the pull-up node PU, so that the clock signal terminal CLK and the output terminal OUT are electrically connected. Because the clock signal provided by the clock signal terminal CLK is at a low level in this stage, the output terminal OUT outputs a low level of the clock signal. At the same time, in this stage, the thirteenth transistor T13 is turned on in response to the high level of the input signal, and the ninth transistor T9 is turned on in response to the high level of the pull-up node PU, so that the pull-down node PD is connected to the fourth voltage terminal VGL, and then the pull-down node PD is pulled down to the fourth voltage (i.e., the low level). Therefore, in this stage, the pull-down node will not affect the charging process of the pull-up node PU, so that the ninth transistor T9 has a larger threshold voltage bias margin, and therefore the requirements on the process conditions of the ninth transistor are relaxed.

In the second stage 2 (i.e., the output stage), the clock signal terminal provides a high level signal, so the output terminal OUT outputs a high level of the clock signal; due to the bootstrap effect of the capacitor, the pull-up node PU is further charged to a high level (e.g., higher than the first level); the ninth transistor T9 is turned on under the control of the level of the pull-up node PU, so that the pull-down node PD is connected to the fourth voltage terminal VGL, thereby maintaining a low level; in this stage, the input signal provided by the input terminal INT changes from the high level in the first stage to the low level, and the potential of the first node N1 decreases due to coupling effect, for example, due to parasitic capacitive coupling of transistors. At the same time, in a subsequent stage, under the condition that the input signal provided by the input terminal INT is kept at a low level, because the first voltage terminal VFD keeps an input of a high level, the first transistor T1 is at a risk of negative bias, and the potential of the first node N1 may be charged to a high level. In this case, the first node N1 may also be discharged to a low level through the third transistor T3 and the input terminal INT. In this way, the second transistor T2 can be maintained in a zero bias state at a subsequent stage (both the first electrode and the second electrode are at a low level), thereby eliminating the risk of bias of the threshold voltage and preventing the formation of a leakage path of the pull-up node PU. Therefore, when the shift register unit 100 is switched from a long-time forward scanning (i.e., the input signal is supplied from the input terminal INT and the first reset terminal RST1 provides the first reset signal) to a reverse scanning, even if the threshold voltage of the first transistor T1 is negatively biased by negative bias thermal stress (NBTS) due to the long-term connection with the first voltage terminal VFD, because the threshold voltage of the second transistor T2 is not shifted, the phenomenon that the GOA circuit has no output after switching the scanning direction due to leakage of the pull-up node PU during charging is avoided.

In the third stage 3 (i.e., reset stage), the first reset terminal RST1 provides a high level signal, the second voltage terminal VBD is configured to provide a DC low level signal, and the fourth transistor T4 and the fifth transistor T5 are turned on in response to the high level signal provided by the first reset terminal RST1, thereby connecting the pull-up node PU with the second voltage terminal VBD and pulling down the pull-up node PU to a low level; the fourteenth transistor T14 is turned on in response to the high level signal provided by the first reset terminal RST1, thereby connecting the pull-down node PD and the fourth voltage terminal VGL. Therefore, in this stage, the pull-down node PD remains at a low level. In this stage, because the seventh transistor T7 is turned off by the low level of the pull-up node PU, the output terminal OUT outputs a low level signal.

In the fourth stage 4 (i.e., the total reset stage), in the interval period before the start of the next frame while after the scanning of one frame is completed, the second reset terminal RST2 provides a high level signal, thereby turning on the twelfth transistor T12 and electrically connecting the pull-up node PU and the fourth voltage terminal VGL to further reset the pull-up node PU.

For example, when the shift register unit 100 performs reverse scanning, the input signal and the first reset signal can be exchanged with each other, that is, the input terminal INT provides the first reset signal and the first reset terminal RST1 provides the input signal. At this time, the first voltage terminal VFD provides a DC low level signal, while the second voltage terminal VBD provides a DC high level signal. The operation principle of the shift register unit 100 during reverse scanning is similar to that during forward scanning, and will not be repeated here. It should be noted that when the input signal provided by the first reset terminal RST1 changes from a high level to a low level, the potential of the second node N2 decreases due to the coupling effect, for example, due to the parasitic capacitance coupling effect of the transistor. Meanwhile, in the subsequent phase of reverse scanning, the input signal provided by the first reset terminal RST1 is kept at a low level. Because the second voltage terminal VBD is kept at a high level, the fourth transistor T4 is at a risk of negative bias, and the potential of the first node N1 may be charged to a high level. In this case, the second node N2 may also be discharged to a low level through the sixth transistor T6 and the input terminal INT, so that the fifth transistor T5 maintains a zero bias state in each phase after the first phase 1, thereby eliminating the risk of the threshold voltage bias and preventing the pull-up node PU from forming a leakage path.

Figure 8:
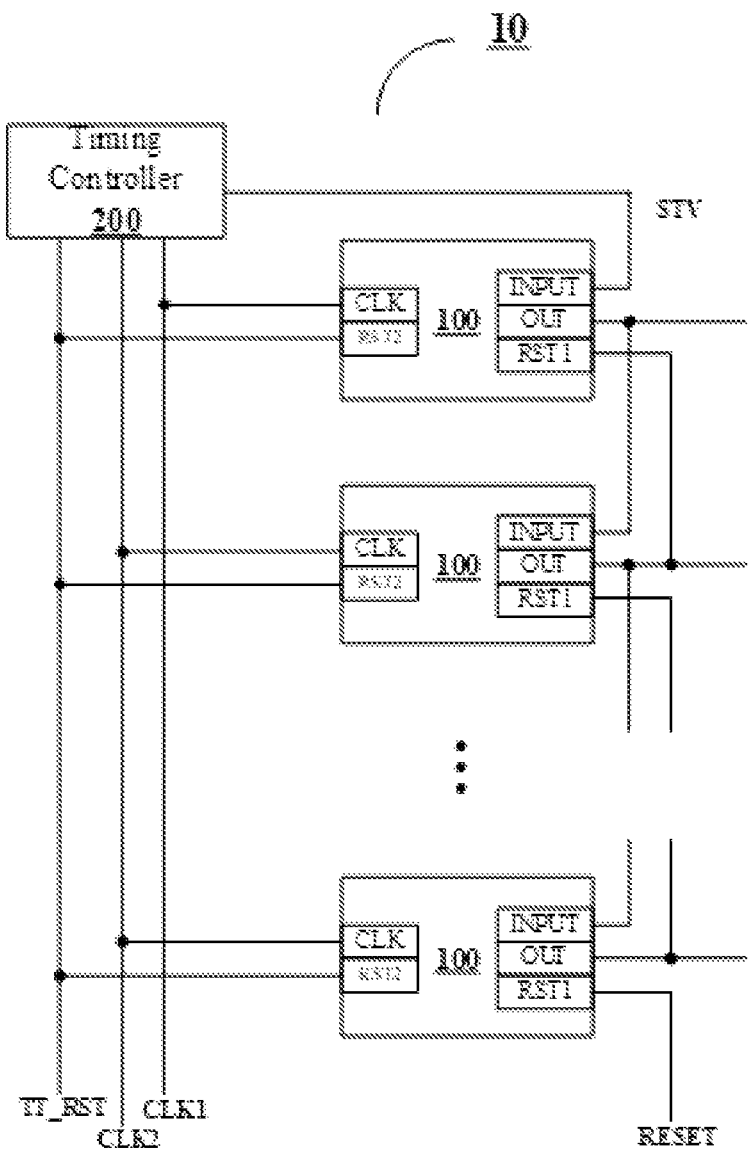
FIG. 8 is a schematic diagram of a gate drive circuit according to an embodiment of the present disclosure.

At least an embodiment of the present disclosure also provides a gate drive circuit. For example, as illustrated in FIG. 8, the gate drive circuit includes a first clock signal line CLK1, a second clock signal line CLK2, a total reset line TT_RST, and a plurality of cascaded shift register units 100. The shift register units may each adopt the shift register unit 100 described in any embodiment of the present disclosure. For example, each shift register unit 100 is described here with the circuit structure illustrated in FIG. 6B as an example, but embodiments of the present disclosure are not limited thereto. The gate drive circuit 10 can be directly integrated on the array substrate of the display device by the same process as that of the thin film transistor to realize the progressive scanning driving function.

For example, as illustrated in FIG. 8, each of the shift register units further includes a clock signal terminal CLK and is configured to be connected to the first clock signal line CLK1 or the second clock signal line CLK2 to receive the first clock signal or the second clock signal. The first clock signal line CLK1 is connected to the clock signal terminal CLK of the (2n−1)th (n is an integer greater than 0) stage shift register unit, and the second clock signal line CLK2 is connected to the clock signal terminal CLK of the (2n)th stage shift register unit. It should be noted that the embodiments of the present disclosure include but are not limited to the above-mentioned connection mode. For example, the first clock signal line CLK1 may be connected to the clock signal terminal CLK of the (2n)th (n is an integer greater than 0) stage shift register unit, and the second clock signal line CLK2 may be connected to the clock signal terminal CLK of the (2n−1)th stage shift register unit.

For example, as illustrated in FIG. 8, each of the shift register units further includes a second reset terminal RST2 which is configured to be connected to a total reset line TT_RST to receive a second reset signal to reset pull-up nodes of all shift register units through a second reset signal provided by the total reset line TT_RST after each frame scan is completed.

For example, as illustrated in FIG. 8, the gate drive circuit 10 may further include a Timing Controller 200. For example, the Timing Controller 200 may be configured to be connected to a first clock signal line CLK1, a second clock signal line CLK2, and a total reset line TT_RST to provide a clock signal and a second reset signal to each shift register unit. For example, the Timing Controller 200 may also be configured to provide a trigger signal STV and a reset signal RESET.

For example, as illustrated in FIG. 8, except for the shift register unit of the last stage, the first reset terminal RST1 of the shift register unit of each of the remaining stages is connected to the output terminal OUT of the shift register unit of the next stage. Except for the shift register unit of the first stage, the input terminal INT of the shift register unit of each of the remaining stages is connected with the output terminal OUT of the shift register unit of the previous stage. For example, for forward scanning, the input terminal INT of the first stage shift register unit can be configured to receive the trigger signal STV, and the first RESET terminal RST1 of the last stage shift register unit can be configured to receive the reset signal RESET. For reverse scanning, the input terminal INT of the first stage shift register unit can be configured to receive the RESET signal RESET, and the first reset terminal RST1 of the last stage shift register unit can be configured to receive the trigger signal STY.

It should be noted that the gate drive circuit 10 may also include four, six or eight clock signal lines according to different configurations. The number of clock signal lines depends on specific circumstances, and the embodiments of the present disclosure are not limited here.

It should be noted that when the gate drive circuit 10 provided in an embodiment of the present disclosure is used to drive a display panel, the gate drive circuit 10 may be disposed on one side of the display panel. For example, the display panel includes a plurality of rows of gate lines, and the output terminals of the shift register units of stages in the gate drive circuit 10 may be configured to be sequentially connected to the plurality of rows of gate lines for outputting gate scanning signals. It should be noted that the gate drive circuits 10 may be provided on both sides of the display panel to realize double-sided driving, and the embodiments of the present disclosure do not limit the arrangement of the gate drive circuits 10. For example, the gate drive circuit 10 may be provided on one side of the display panel for driving odd row gate lines, while the gate drive circuit 10 may be provided on the other side of the display panel for driving even row gate lines.

The gate drive circuit can avoid the phenomenon of no output after switching scanning directions due to negative bias of the threshold voltage of the transistor at the input end, enhance the stability of the circuit, and enable the transistor to have a larger threshold voltage bias margin.

Figure 9:
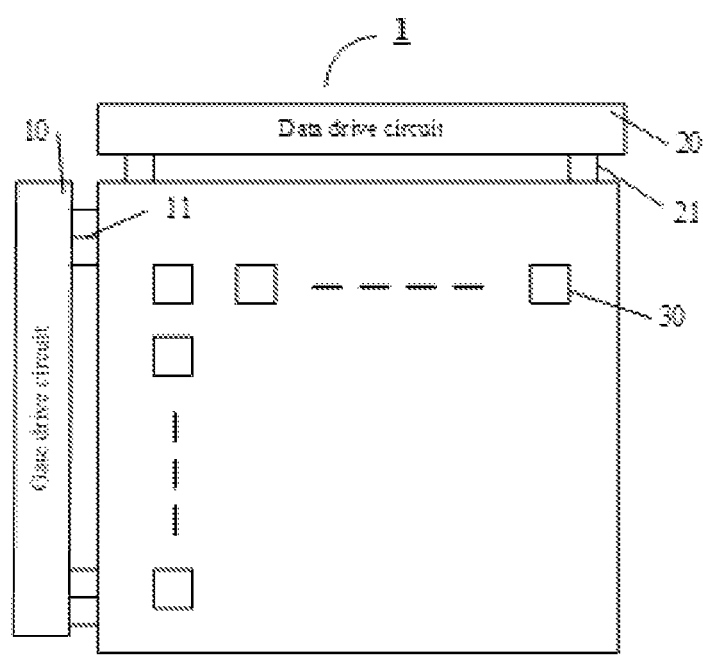
FIG. 9 is a schematic diagram of a display device according to an embodiment of the present disclosure.

An embodiment of the present disclosure also provides a display device 1. As illustrated in FIG. 9, the display device 1 includes a gate drive circuit 10 provided in any embodiment of the present disclosure. The display device 1 includes a pixel array comprises a plurality of pixel units 30. For example, the display device 1 may further include a data driving circuit 20. The data driving circuit 20 is used for providing data signals to the pixel array; the gate drive circuit 10 is used to provide gate scan signals to the pixel array. The data driving circuit 20 is electrically connected to the pixel units 30 through the data lines 21, and the gate drive circuit 10 is electrically connected to the pixel units 30 through the gate lines 11.

It should be noted that the display device 1 in the embodiment can be any product or component with a display function such as a liquid crystal panel, a liquid crystal television, a display, an OLED panel, an OLED TV, an electronic paper display device, a mobile phone, a tablet computer, a notebook computer, a digital photo frame, a navigator, etc. The display device 1 may also include other conventional components such as a display panel, and the embodiments of the present disclosure are not limited thereto.

The technical effect of the display device 1 provided by the embodiment of the present disclosure may refer to the corresponding description of the gate drive circuit 10 in the above embodiment, and will not be described here again.

It should be noted that the entire structure of the display device 1 is not given for clarity and conciseness. In order to realize the necessary functions of the display device, those skilled in the art can set other structures not illustrated according to specific application scenarios, and the embodiments of the present disclosure are not limited to this.

An embodiment of the present disclosure also provides a driving method, such as a shift register unit for a display device. For example, in the example illustrated in FIG. 4B or FIG. 5B, the driving method of the shift register unit includes the following operations:

In the first stage, the input circuit 110 performs a first control (e.g., charging to a first level) on the pull-up node PU and the first node N1 in response to the input signal, and the output circuit 130 outputs the low level of an output signal (e.g., a clock signal) to the output terminal OUT.

In the second stage, the input circuit 110 performs a second control (e.g., discharging to a second level) on the first node N1 in response to the level of the first node N1, and the output circuit 130 outputs the high level of the output signal to the output terminal OUT.

In the third stage, the first pull-up node reset circuit 120 resets the pull-up node PU under the control of the first reset signal.

For example, in the example as illustrated in FIG. 6B, the driving method of the shift register unit includes the following operations:

In the first stage, the input circuit 110 performs a first control on the pull-up node PU and the first node N1 in response to the input signal, the second pull-down node control circuit 180 performs a second control on the level of the pull-down node PD in response to the input signal, e.g., pulls down to a second level (e.g., a fourth voltage), and the output circuit 130 outputs a low level of the output signal to the output terminal OUT.

In the second stage, the input circuit 110 performs second control on the first node N1 in response to the first level of the first node N1, and the output circuit 130 outputs the high level of the output signal to the output terminal OUT.

In the third stage, the first pull-up node reset circuit 120 resets the pull-up node PU under the control of the first reset signal, and the second pull-down node control circuit 180 performs a second control on the level of the pull-down node PD in response to the first reset signal.

For example, in another example, when reverse scanning is performed by the display panel using the shift register unit 100, the input signal and the first reset signal can be exchanged with each other, that is, the first reset terminal RST1 provides the input signal and the input terminal INT provides the first reset signal. At this time, the driving method includes the following operations:

In the first stage, the first pull-up node reset circuit 120 performs a first control on the pull-up node PU and the second node N2 in response to the input signal, and the output circuit 130 outputs the low level of the output signal to the output terminal OUT.

In the second stage, the first pull-up node reset circuit 120 performs a second control on the second node N2 in response to the first level of the second node N2, and the output circuit 130 outputs the high level of the output signal to the output terminal OUT.

In the third stage, the input circuit 110 resets the pull-up node PU under the control of the first reset signal.

It should be noted that the detailed description and technical effect of the driving method can refer to the description of the working principle of the shift register unit 100 in the embodiment of the present disclosure, which is not repeated here.

The following points need to be noted:

(1) The drawings of the embodiments of the present disclosure only refer to the structures involved in the embodiments of the present disclosure, and other structures may refer to the general design.

(2) Without conflict, the embodiments of the present disclosure and the features in the embodiments can be combined with each other to obtain new embodiments.

The above description is only a specific embodiment of the present disclosure, but the scope of protection of the present disclosure is not limited thereto, and the scope of protection of the present disclosure shall be subject to the scope of protection of the claims.

What is claimed is:

1. A shift register unit comprising: an input circuit, a first reset circuit, a second control circuit and an output circuit, wherein the input circuit includes an input terminal configured to perform a first control on a first control node and a first node in response to an input signal of the input terminal, and then perform a second control, which is different from the first control, on the first node under a control of the first node, the first node is located in a path where the input signal incurs the first control on the first control node;

the first reset circuit is configured to reset the first control node in response to a first reset signal;

the second control circuit is configured to perform the second control on a second control node in response to the input signal and to perform the second control on the second control node in response to the first reset signal; and the output circuit is configured to output an output signal to an output terminal under a control of a level of the first control node;

wherein the second control circuit comprises:

a thirteenth transistor, wherein a gate electrode of the thirteenth transistor is connected to the input terminal to receive the input signal, a first electrode of the thirteenth transistor is connected to the second control node, and a second electrode of the thirteenth transistor is connected to a fourth voltage terminal to receive a fourth voltage, and a fourteenth transistor, wherein a gate electrode of the fourteenth transistor is connected to a first reset terminal to receive the first reset signal, a first electrode of the fourteenth transistor is connected to the second control node, and a second electrode of the fourteenth transistor is connected to the fourth voltage terminal to receive the fourth voltage.

2. The shift register unit according to claim 1, wherein the input circuit comprises a first input sub-circuit, a second input sub-circuit and a first node discharge sub-circuit;

the first input sub-circuit is configured to perform the first control on the first node in response to the input signal;

the second input sub-circuit is configured to perform the first control on the first control node in response to the input signal; and the first node discharge sub-circuit is configured to perform the second control on the first node under the control of the level of the first node.

3. The shift register unit according to claim 2, wherein the first input sub-circuit includes:

a first transistor, wherein a gate electrode of the first transistor is connected to the input terminal to receive the input signal, a first electrode of the first transistor is connected to a first voltage terminal to receive a first voltage, and a second electrode of the first transistor is connected to the first node;

the second input sub-circuit includes:

a second transistor, wherein a gate electrode of the second transistor is connected to the input terminal to receive the input signal, a first electrode of the second transistor is connected to the first node, and a second electrode of the second transistor is connected to the first control node; and the first node discharge sub-circuit includes:

a third transistor, wherein a gate electrode and a first electrode of the third transistor are electrically connected to each other and configured to be both connected to the first node, and a second electrode of the third transistor is connected to a second control path.

4. The shift register unit according to claim 3, wherein the second control path is the input terminal.

5. The shift register unit according to claim 1, wherein the first reset circuit is symmetrically disposed with the input circuit, and the first reset circuit includes a first reset terminal and is configured to perform the second control on a second node under a control of levels of the first reset signal of the first reset terminal and the second node, and the second node is located in a path where the first reset signal incurs the second control on the first control node.

6. The shift register unit according to claim 5, wherein the first reset circuit comprises a first reset sub-circuit, a second reset sub-circuit and a second node discharge sub-circuit, wherein the first reset sub-circuit is configured to reset the second node in response to the first reset signal;

the second reset sub-circuit is configured to reset the first control node in response to the first reset signal; and the second node discharge sub-circuit is configured to perform the second control on the second node under the control of the level of the second node.

7. The shift register unit according to claim 6, wherein the first reset sub-circuit includes:

a fourth transistor, wherein a gate electrode of the fourth transistor is connected to the first reset terminal to receive the first reset signal, a first electrode of the fourth transistor is connected to a second voltage terminal to receive a second voltage, and a second electrode of the fourth transistor is connected to the second node;

the second reset sub-circuit includes:

a fifth transistor, wherein a gate electrode of the fifth transistor is connected to the first reset terminal to receive the first reset signal, a first electrode of the fifth transistor is connected to the second node, and a second electrode of the fifth transistor is connected to the first control node; and the second node discharge sub-circuit includes:

a sixth transistor, wherein a gate electrode and a first electrode of the sixth transistor are electrically connected to each other and configured to be both connected to the second node, and a second electrode of the sixth transistor is connected to the first reset terminal.

8. The shift register unit according to claim 1, wherein the output circuit comprises:

a seventh transistor, wherein a gate electrode of the seventh transistor is connected to the first control node, a first electrode of the seventh transistor is connected to a clock signal terminal to receive a clock signal as the output signal, and a second electrode of the seventh transistor is connected to the output terminal; and a first storage capacitor, wherein a first electrode of the first storage capacitor is connected to the first control node, and a second electrode of the first storage capacitor is connected to the output terminal.

9. The shift register unit according to claim 1, further comprising a first control circuit, a first control node noise reduction circuit and an output noise reduction circuit, wherein the first control circuit is configured to control a level of a second control node;

the first control node noise reduction circuit is configured to reduce noise at the first control node under a control of the level of the second control node; and the output noise reduction circuit is configured to reduce noise at the output terminal under a control of the level of the second control node.

10. The shift register unit according to claim 9, wherein the first control circuit includes:

an eighth transistor, wherein a gate electrode and a first electrode of the eighth transistor are electrically connected to each other and configured to be both connected to a third voltage terminal to receive a third voltage, and a second electrode of the eighth transistor is connected to the second control node;

a ninth transistor, wherein a gate electrode of the ninth transistor is connected to the first control node, a first electrode of the ninth transistor is connected to the second control node, and a second electrode of the ninth transistor is connected to a fourth voltage terminal to receive a fourth voltage;

the first control node noise reduction circuit includes:

a tenth transistor, wherein a gate electrode of the tenth transistor is connected to the second control node, a first electrode of the tenth transistor is connected to the first control node, and a second electrode of the tenth transistor is connected to the fourth voltage terminal to receive the fourth voltage; and the output noise reduction circuit includes:

an eleventh transistor, wherein a gate electrode of the eleventh transistor is connected to the second control node, a first electrode of the eleventh transistor is connected to the output terminal, and a second electrode of the eleventh transistor is connected to the fourth voltage terminal to receive the fourth voltage.

11. The shift register unit according to claim 1, further comprising a second reset circuit, wherein the second reset circuit is configured to reset the first control node in response to a second reset signal.

12. The shift register unit according to claim 11, wherein the second reset circuit comprises: a twelfth transistor, wherein a gate electrode of the twelfth transistor is connected to a second reset terminal to receive the second reset signal, a first electrode of the twelfth transistor is connected to the first control node, and a second electrode of the twelfth transistor is connected to a fourth voltage terminal to receive a fourth voltage.

13. A gate drive circuit comprising the shift register unit according to claim 1.

14. A display device comprising the gate drive circuit according to claim 13.

15. A driving method of a shift register unit, wherein the shift register unit comprises an input circuit, a first reset circuit, a second control circuit and an output circuit, the input circuit includes an input terminal configured to perform a first control on a first control node and a first node in response to an input signal of the input terminal, and then perform a second control, which is different from the first control, on the first node under a control of the first node, the first node is located in a path where the input signal incurs the first control on the first control node;

the first reset circuit is configured to reset the first control node in response to a first reset signal;

the second control circuit is configured to perform the second control on a second control node in response to the input signal and to perform the second control on the second control node in response to the first reset signal;

the output circuit is configured to output an output signal to an output terminal under a control of a level of the first control node; and the driving method comprises:

in a first stage, the input circuit performing the first control on the first control node and the first node in response to the input signal, the second control circuit performing the second control on the level of the second control node in response to the input signal, and the output circuit outputting the low level of the output signal to the output terminal;

in a second stage, the input circuit performing the second control on the first node in response to the level of the first node, and the output circuit outputting the high level of the output signal to the output terminal; and in a third stage, the first reset circuit resetting the first control node under the control of the first reset signal, and the second control circuit performing the second control on the level of the second control node in response to the first reset signal.

16. A driving method of a shift register unit, wherein the shift register unit comprises an input circuit, a first reset circuit, a second control circuit and an output circuit, the input circuit includes an input terminal configured to perform a first control on a first control node and a first node in response to an input signal of the input terminal, and then perform a second control, which is different from the first control, on the first node under a control of the first node, the first node is located in a path where the input signal incurs the first control on the first control node;

the first reset circuit is configured to reset the first control node in response to a first reset signal;

the second control circuit is configured to perform the second control on a second control node in response to the input signal and to perform the second control on the second control node in response to the first reset signal;

the output circuit is configured to output an output signal to an output terminal under a control of a level of the first control node;

the first reset circuit is symmetrically disposed with the input circuit, the first reset circuit includes a first reset terminal and is configured to perform the second control on the second node under a control of levels of the first reset signal and the second node of the first reset terminal, and the second node is located in a path where the first reset signal incurs the second control on the first control node;

the input signal and the first reset signal are exchanged with each other, and the driving method comprises:

in a first stage, the first reset circuit performing the first control on the first control node and the second node in response to the input signal, the second control circuit performing the second control on the level of the second control node in response to the input signal, and the output circuit outputting the low level of the output signal to the output terminal;

in a second stage, the first reset circuit performing the second control on the second node in response to the level of the second node, and the output circuit outputting the high level of the output signal to the output terminal; and in a third stage, the input circuit resetting the first control node under the control of the first reset signal, and the second control circuit performing the second control on the level of the second control node in response to the first reset signal.

* * * * *

UNITED STATES PATENT AND TRADEMARK OFFICE
CERTIFICATE OF CORRECTION

PATENT NO. : 11,100,878 B2
APPLICATION NO. : 16/461818
DATED : August 24, 2021
INVENTOR(S) : Zhichong Wang et al.

It is certified that error appears in the above-identified patent and that said Letters Patent is hereby corrected as shown below:

On the Title Page

Item (73) "ORDOS YUANSHENG OPTOELECTRONICS CO., LTD" should be --ORDOS YUANSHENG OPTOELECTRONICS CO., LTD.--

Signed and Sealed this
Twenty-fourth Day of May, 2022

Katherine Kelly Vidal
*Director of the United States Patent and Trademark Office*